(12) United States Patent
Kawaguchi et al.

(10) Patent No.: US 6,372,928 B1
(45) Date of Patent: Apr. 16, 2002

(54) LAYER FORMING MATERIAL AND WIRING FORMING METHOD

(75) Inventors: Akemi Kawaguchi; Yuka Terai; Kousaku Yano, all of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/003,826

(22) Filed: Jan. 7, 1998

Related U.S. Application Data

(62) Division of application No. 08/618,165, filed on Mar. 19, 1996, now Pat. No. 5,773,639.

(30) Foreign Application Priority Data

Mar. 20, 1995 (JP) .............................................. 7-060750

(51) Int. Cl.$^7$ ............................ C07F 1/08; C23C 16/00
(52) U.S. Cl. ........................ 556/10; 556/113; 427/150; 430/320
(58) Field of Search ................... 556/10, 113; 427/250; 430/320

(56) References Cited

U.S. PATENT DOCUMENTS

| | | | |
|---|---|---|---|
| 5,085,731 A | 2/1992 | Norman et al. | ............. 156/646 |
| 5,144,049 A | 9/1992 | Norman et al. | ............... 556/12 |
| 5,187,300 A | 2/1993 | Norman | ........................ 556/12 |
| 5,220,044 A | 6/1993 | Baum et al. | .................. 556/40 |
| 5,225,561 A | 7/1993 | Kirlin et al. | ................ 546/256 |

OTHER PUBLICATIONS

Hursthouse, M.B. et al. "*Exchange of Cobalt (II) for Copper (II) in Spirocyclic Mettalasiloxane Compound*", J. Chem. Soc. Chem. Comm., 1991, 24, pp. 1709–1710.

Schmidt, G. et al. "*Organomettalic Copper Compounds, IX,*" J. Organomet.Chem., 1995, 503(1), pp.101–109.

Schmidt, G. et al., "*Organomettalic Compounds of Copper, X,*" J. Organomet.Chem., 1996, 509(1), pp. 49–55.

Jain, A. et al., "*Chemical Vapor Deposition of Cooper from (Hexafluoroacetylacetonato) (alkyne) Copper (I) Complexes via Disproportionation,*" Chem. Mat., 1991, 3, pp.995–997.

Lang, H. et al., "*Monomeric (acetylacetonato) Copper (i) Complexes of Alkynes and 1,4–Diynes,*" Chem.Ber., 1995, 128(5), pp. 525–529.

Primary Examiner—Porfirio Nazario-Gonzalez
(74) Attorney, Agent, or Firm—McDermott, Will & Emery

(57) ABSTRACT

A layer forming material is a compound which has a structure of six-membered ring coordinated to Cu and containing Si, and of which general formula is represented by the following chemical formula:

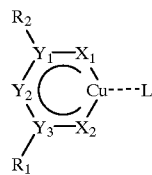

wherein $X_1$ and $X_2$ are elements of the VI group of the same or different types which are coordinate-bonded to Cu, and of which examples include O, S, Se, Te and the like, at least one of $Y_1$, $Y_2$ and $Y_3$ is Si, L is a group which has a double or triple bond and which is able to supply electrons to Cu, and each of $R_1$ and $R_2$ is any of $SiF_3$, $SiH_3$, $CF_3$ and $CH_3$ for example.

1 Claim, 8 Drawing Sheets

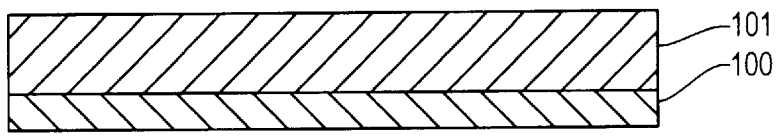
FIG. 6 (a) PRIOR ART
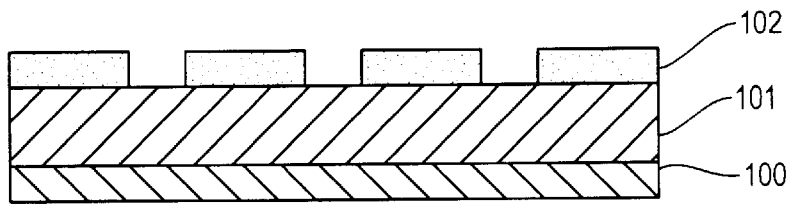
FIG. 6 (b) PRIOR ART
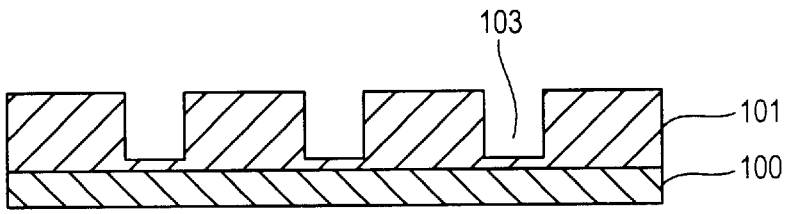
FIG. 6 (c) PRIOR ART
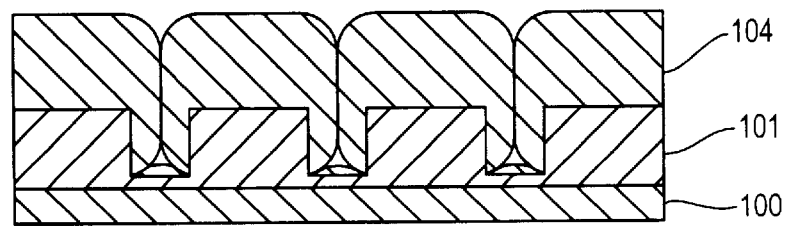
FIG. 6 (d) PRIOR ART
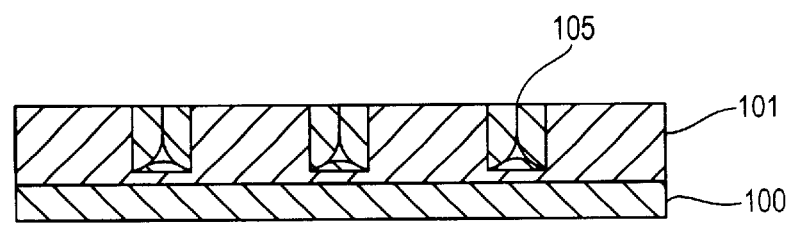
FIG. 6 (e) PRIOR ART
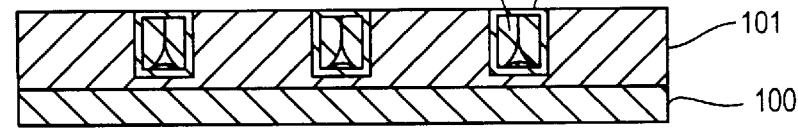
FIG. 6 (f) PRIOR ART

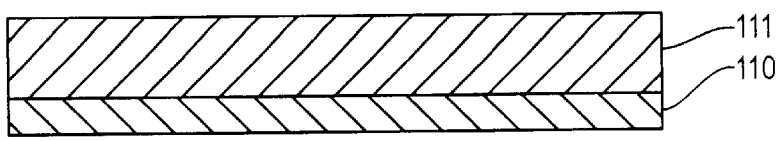
FIG. 7 (a) PRIOR ART
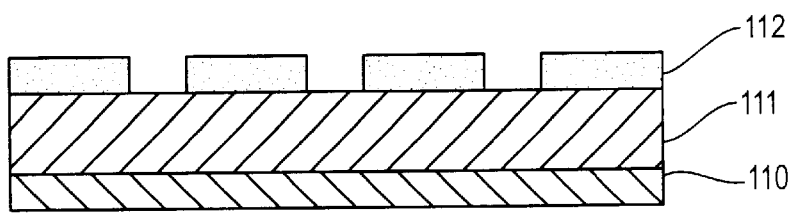
FIG. 7 (b) PRIOR ART
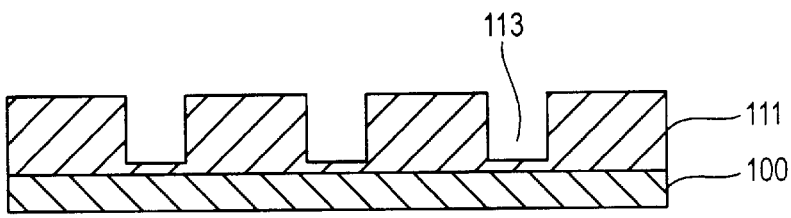
FIG. 7 (c) PRIOR ART
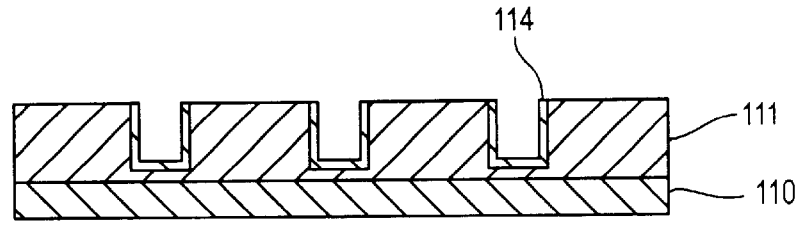
FIG. 7 (d) PRIOR ART

LAYER FORMING MATERIAL AND WIRING FORMING METHOD

This is a divisional of application Ser. No. 08/618,165, filed Mar. 19, 1996 now U.S. Pat. No. 5,773,639.

BACKGROUND OF THE INVENTION

The present invention relates to a layer forming material for forming copper wiring on a substrate, and also to a copper wiring forming method.

Conventionally, aluminium has mainly be used as a wiring material of a semiconductor integrated circuit formed on a semiconductor substrate made of Si. Due to the requirements for higher integration and higher speed of a semiconductor integrated circuit, however, attention is now placed, as the wiring material, on copper excellent in resistance to high stress migration and high electromigration.

The following description will discuss, as a first example of prior art, a method of forming copper wiring on a substrate using a sputtering method with reference to FIGS. 6(a) to (e).

As shown in FIG. 6(a), an insulating layer 101 of SiO$_2$ is deposited on the whole surface of a substrate 100 of Si. Then, as shown in FIG. 6(b), a resist pattern 102 is formed on the insulating layer 101 by photolithography. Then, as shown in FIG. 6(c), the insulating layer 101 is etched with the resist pattern 102 serving as a mask, thereby to form a concave portion 103 for wiring.

As shown in FIG. 6(d), a sputtering method is applied with the use of a target of Si-containing Cu, thereby to deposit a Si-containing copper layer 104 on the whole surface of the insulating layer 101. Then, as shown in FIG. 6(e), that portion of the copper layer 104 which projects from the surface of the insulating layer 101, is removed by a CMP method for example, thereby to form copper wiring 105 formed by the copper layer 104. Then, the substrate 100 is thermally treated, as shown in FIG. 6(f), to form a copper silicide layer 106 on the surface of the copper wiring 105.

The following is the reason of why the copper silicide layer 106 is formed. Copper is liable to be readily oxidized by a heat treatment of about 300° C. in the atmosphere of a trace amount of oxygen since copper is low in resistance to oxidation. Accordingly, when the copper wiring 105 comes in contact with an oxygen-containing layer of SiO$_2$ or the like forming the insulating layer 101, the oxidation of copper is advanced with the passage of time in the heating step. Even though the copper wiring 105 does not come in contact with an oxygen-containing layer, the copper wiring 105 comes in contact with the air during the heat treatment. This disadvantageously results in an increase in resistance of the copper wiring 105. Also, the characteristics of the transistor and the like may be degraded by diffusing copper in the copper wiring 105 into the insulating layer 101. In addition, direct deposition of the copper wiring 105 onto the insulating layer 101 results in less adhesiveness between the copper wiring 105 and the insulating layer 101. To prevent the copper wiring 105 from coming in contact with the insulating layer 101 or the air, the copper silicide layer 106 is formed on the surface of the copper wiring 105.

When the wiring rule is small in depositing the copper layer 104 on the insulating layer 101 by a sputtering method, voids 107 are disadvantageously formed as shown in FIG. 6(d). The voids 107 remain also in the copper wiring 105. This disadvantageously contributes to disconnection.

Recently, attention is placed on the technology of forming a copper layer and copper wiring by a CVD (Chemical Vapor Deposition) method using an organic copper complex compound as a precursor. In the field of semiconductor device, study has extensively been made on this technology.

With reference to FIGS. 7(a) to (d) and FIGS. 8(a) to (c), the following description will discuss, as a second example of prior art, a copper wiring forming method by the CVD method.

As shown in FIG. 7(a), an insulating layer 111 of SiO$_2$ is formed on the whole surface of a substrate 110 of Si. Then, as shown in FIG. 7(b), a resist pattern 112 is formed on the insulating layer 111 by photolithography. Then, as shown in FIG. 7(c), the insulating layer 111 is etched with the resist pattern 112 serving as a mask, thereby to form a wiring concave 113.

As shown in FIG. 7(d), a first barrier layer 114 made of WSiN for example is deposited on the wall and bottom surfaces of the wiring concave 113 by a sputtering or CVD method. Then, as shown in FIG. 8(a), a copper layer 115 is deposited on the whole surface of the insulating layer 111 by a CVD method. Then, as shown in FIG. 8(b), that portion of the copper layer 115 which projects from the surface of the insulating layer 111, is eliminated by a CMP method for example, thus forming copper wiring 116 formed by the copper layer 115. Then, as shown in FIG. 8(c), a second barrier layer 117 of WSiN for example is deposited on the whole surfaces of the copper wiring 116 and the insulating layer 111 by a sputtering or CVD method. The first and second barrier layers 114, 117 in the second example of prior art, act in the same way as the copper silicide layer 106 acts in the first example of prior art.

To deposit the copper layer 115 by a CVD method, there is known, as the layer forming material to be supplied to the substrate 110, an organic copper complex compound which is in the form of a liquid or a solid at room temperature. In using a liquid organic copper complex compound in a CVD method, there are known two methods; i.e., a first method in which the organic copper complex compound is caused to pass, in the form of a liquid, through a liquid mass flow meter, the compound is increased in temperature to cause the same to be evaporated by a vaporizer, and the resulting gaseous organic copper complex compound is then introduced into a reaction chamber; and a second method in which a liquid organic copper complex compound is evaporated by bubbling and the resulting gaseous organic copper complex compound is introduced into a reaction chamber through a heated pipe.

As an example of the organic copper complex compound of prior art, there is known, as disclosed by U.S. Pat. No. 5,144,049, L=H$_2$C=CH—SiMe$_3$ ((hfac)CU(vinyl trimethyl silane)) in which the ligand is the β diketone type as shown by the following chemical formula:

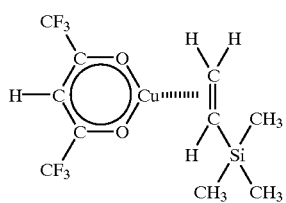

When this organic copper complex compound is a solid, the solid organic copper complex compound is dissolved in an organic solvent, e.g., isopropyl alcohol, and the resulting solution is introduced into a reaction chamber in the same manner as done in the liquid organic copper complex compound.

According to the copper wiring forming method using a CVD method, to form a barrier layer on the surface of the copper wiring 116, the first barrier layer 114 and the second barrier layer 117 are required to be formed at different steps. This increases the number of steps to disadvantageously lengthen the whole process.

Further, when copper wiring is formed using an organic copper complex compound of prior art, carbon is put, as impurity, into the copper wiring. This advantageously increases the copper wiring in resistance.

SUMMARY OF THE INVENTION

In a copper wiring forming technology using a CVD method, it is a first object of the present invention to reduce the number of the steps of forming barrier layers on the surface of the copper wiring. It is a second object of the present invention to lower the copper wiring in resistance.

A first layer forming material according to the present invention comprises a compound which has a structure of six-membered ring coordinated to Cu and containing Si, and of which general formula is represented by the following chemical formula:

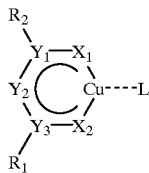

(wherein $X_1$ and $X_2$ are elements of the VI group of the same or different types which are coordinate-bonded to Cu, at least one of $Y_1$, $Y_2$ and $Y_3$ is Si, L is a group which has a double or triple bond and which is able to supply electrons to Cu, and each of $R_1$ and $R_2$ is an optional element or compound).

According to the first layer forming material, Si is contained in the structure of six-membered ring. Accordingly, when a copper layer formed using the first layer forming material is thermally treated, Si is segregated to the surface of the copper layer to form, on the surface of the copper layer, a barrier layer comprising a copper silicide layer. Thus, when a copper layer is formed by a CVD method using the first layer forming material, a barrier layer can be formed on the surface of the copper layer, without the number of production steps increased.

In the first layer forming material, each of $Y_1$, $Y_2$ and $Y_3$ in the general formula above-mentioned is preferably Si. In this case, since C is not contained in the structure of six-membered ring, a copper layer formed by this layer forming material is lowered in resistance.

In the first layer forming material, L in the general formula above-mentioned is preferably a group of which backbone chain has a double or triple bond and in which all the skeletons contain Si. When a copper layer formed by such a layer forming material, is thermally treated, a barrier layer of a copper silicide layer is sufficiently formed on the surface of the copper layer. This securely prevents the copper layer from being oxidized.

In the first layer forming material, each of $R_1$ and $R_2$ in the general formula above-mentioned is preferably a Si-containing group. When a copper layer formed by such a layer forming material, is thermally treated, a barrier layer of a copper silicide layer is sufficiently formed on the surface of the copper layer. This securely prevents the copper layer from being oxidized.

A second layer forming material according to the present invention comprises a compound which has a structure of six-membered ring coordinated to Cu and containing Si, and of which general formula is represented by the following chemical formula:

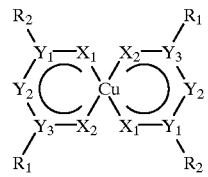

(wherein $X_1$ and $X_2$ are elements of the VI group of the same or different types which are coordinate-bonded to Cu, at least one of $Y_1$, $Y_2$ and $Y_3$ is Si, and each of $R_1$ and $R_2$ is an optional element or compound).

According to the second layer forming material, Si is contained in the structure of six-membered ring. Accordingly, when a copper layer formed using the second layer forming material is thermally treated, Si is segregated to the surface of the copper layer to form, on the surface of the copper layer, a barrier layer formed by a copper silicide layer. Accordingly, when the second layer forming material is used to form a copper layer by a CVD method, a barrier layer can be formed on the surface of the copper layer without the number of production steps increased.

In the second layer forming material, each of $Y_1$, $Y_2$ and $Y_3$ in the general formula above-mentioned is preferably Si. In this case, since C is not contained in the structure of six-membered ring, the copper layer formed by this layer forming material is lowered in resistance.

In the second layer forming material, each of $R_1$ and $R_2$ in the general formula is preferably a Si-containing group. When a copper layer formed by such a layer forming material, is thermally treated, a barrier layer comprising a copper silicide layer is sufficiently formed on the surface of the copper layer. This securely prevents the copper layer from being oxidized.

A first wiring forming method according to the present invention comprises:

a step of using a CVD method to supply, to a substrate, a layer forming material which has a structure of six-membered ring coordinated to Cu and containing Si, and of which general formula is represented by the following chemical formula:

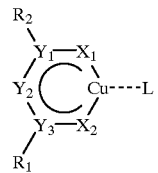

(wherein $X_1$ and $X_2$ are elements of the VI group of the same or different types which are coordinate-bonded to Cu, at least one of $Y_1$, $Y_2$ and $Y_3$ is Si, L is a group which has a double or triple bond and which is able to supply electrons to Cu, and each of $R_1$ and $R_2$ is an optional element or compound), thereby to deposit a Si-containing copper layer on the substrate;

a step of forming resist pattern on the copper layer and then etching the copper layer with the resist pattern serving as a mask, thereby to form copper wiring formed by the copper layer; and a step of thermally treating the substrate, causing Si contained in the copper wiring to be segregated to the surface of the copper wiring, thereby to form a copper silicide layer on the surface of the copper wiring.

According to the first wiring forming method, Si is contained in the structure of six-membered ring of the compound serving as the layer forming material. Accordingly, when copper wiring formed using this layer forming material is thermally treated, Si is segregated to the surface of the copper wiring to form, on the surface of the copper layer, a barrier layer formed by a copper silicide layer.

A second wiring forming method according to the present invention comprises:

a step of using a CVD method to supply, to a substrate, a layer forming material which has a structure of six-membered ring coordinated to Cu and containing Si, and of which general formula is represented by the following chemical formula:

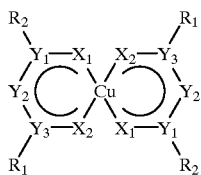

(wherein $X_1$ and $X_2$ are elements of the VI group of the same or different types which are coordinate-bonded to Cu, at least one of $Y_1$, $Y_2$ and $Yi_3$ is Si, and each of $R_1$ and $R_2$ is an optional element or compound), thereby to deposit a Si-containing copper layer on the substrate;

a step of forming a resist pattern on the copper layer and then etching the copper layer with the resist pattern serving as a mask, thereby to form copper wiring formed by the copper layer; and a step of thermally treating the substrate, causing Si contained in the copper wiring to be segregated to the surface of the copper wiring, thereby to form a copper silicide layer on the surface of the copper wiring.

According to the second wiring forming method, Si is contained in the structure of six-membered ring of the compound serving as the layer forming material. Accordingly, when the copper wiring is thermally treated, a barrier layer of a copper silicide layer is formed on the surface of the copper wiring, likewise in the first wiring forming method.

A third wiring forming method of the present invention comprises:

a step of depositing an insulating layer on a substrate;

a step of forming a resist pattern on the insulating layer and then etching the insulating layer with the resist pattern serving as a mask, thereby to form a wiring concave in the insulating layer;

a step of using a CVD method to supply, to the insulating layer, a layer forming material which has a structure of six-membered ring coordinated to Cu and containing Si, and of which general formula is represented by the following chemical formula:

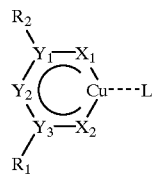

(wherein $X_1$ and $X_2$ are elements of the VI group of the same or different types which are coordinate-bonded to Cu, at least one of $Y_1$, $Y_2$ and $Y_3$ is Si, L is a group which has a double or triple bond and which is able to supply electrons to Cu, and each of $R_1$ and $R_2$ is an optional element or compound), thereby to form, in the wiring concave in the insulating layer, copper wiring formed by a Si-containing copper layer; and a step of thermally treating the substrate, causing Si contained in the copper wiring to be segregated to the surface of the copper wiring, thereby to form a copper silicide layer on the surface of the copper wiring.

According to the third wiring forming method, Si is contained in the structure of six-membered ring of the compound serving as the layer forming material. Accordingly, when the copper wiring is thermally treated, a barrier layer of a copper silicide layer is formed on the surface of the copper wiring, likewise in the first wiring forming method.

A fourth wiring forming method according to the present invention comprises:

a step of depositing an insulating layer on a substrate;

a step of forming a resist pattern on the insulating layer and then etching the insulating layer with the resist pattern serving as a mask, thereby to form a wiring concave in the insulating layer;

a step of using a CVD method to supply, to the insulating layer, a layer forming material which has a structure of six-membered ring coordinated to Cu and containing Si, and of which general formula is represented by the following chemical formula:

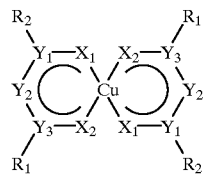

(wherein $X_1$ and $X_2$ are elements of the VI group of the same or different types which are coordinate-bonded to Cu, at least one of $Y_1$, $Y_2$ and $Y_3$ is Si, and each of $R_1$ and $R_2$ is an optional element or compound), thereby to form, in the wiring concave in the insulating layer, copper wiring formed by a Si-containing copper layer; and a step of thermally treating the substrate, causing Si contained in the copper wiring to be segregated to the surface of the copper wiring, thereby to form a copper silicide layer on the surface of the copper wiring.

According to the fourth wiring forming method, Si is contained in the structure of six-membered ring of the compound serving as the layer forming material. Accordingly, when the copper wiring is thermally treated, a barrier layer formed by the copper silicide layer is formed on the surface of the copper wiring, likewise in the first wiring forming method.

Thus, according to each of the first to fourth wiring forming methods above-mentioned, Si is contained in the structure of six-membered ring of the layer forming material. Accordingly, when the copper wiring is thermally treated, Si is segregated to the surface of the copper wiring to form, on the surface of the copper wiring, a barrier layer formed by a copper silicide layer. Thus, a barrier layer can be formed on the copper wiring without the number of production steps increased, although the copper wiring is formed by a CVD method.

BRIEF DESCRIPTION OF THE DRAWINGS

FIGS. 6(a) to (f) are section views of the steps of a first wiring forming method of prior art;

FIGS. 7(a) to (d) are section views of steps of a second wiring forming method of prior art.

DETAILED DESCRIPTION OF THE INVENTION

The following description will discuss each of embodiments of the present invention with reference to attached drawings. As a premise of the following description, there will first be discussed, with reference to FIGS. 1 and 2, a CVD apparatus for depositing a copper layer to be used in each of the embodiments of the present invention.

Figure 1:
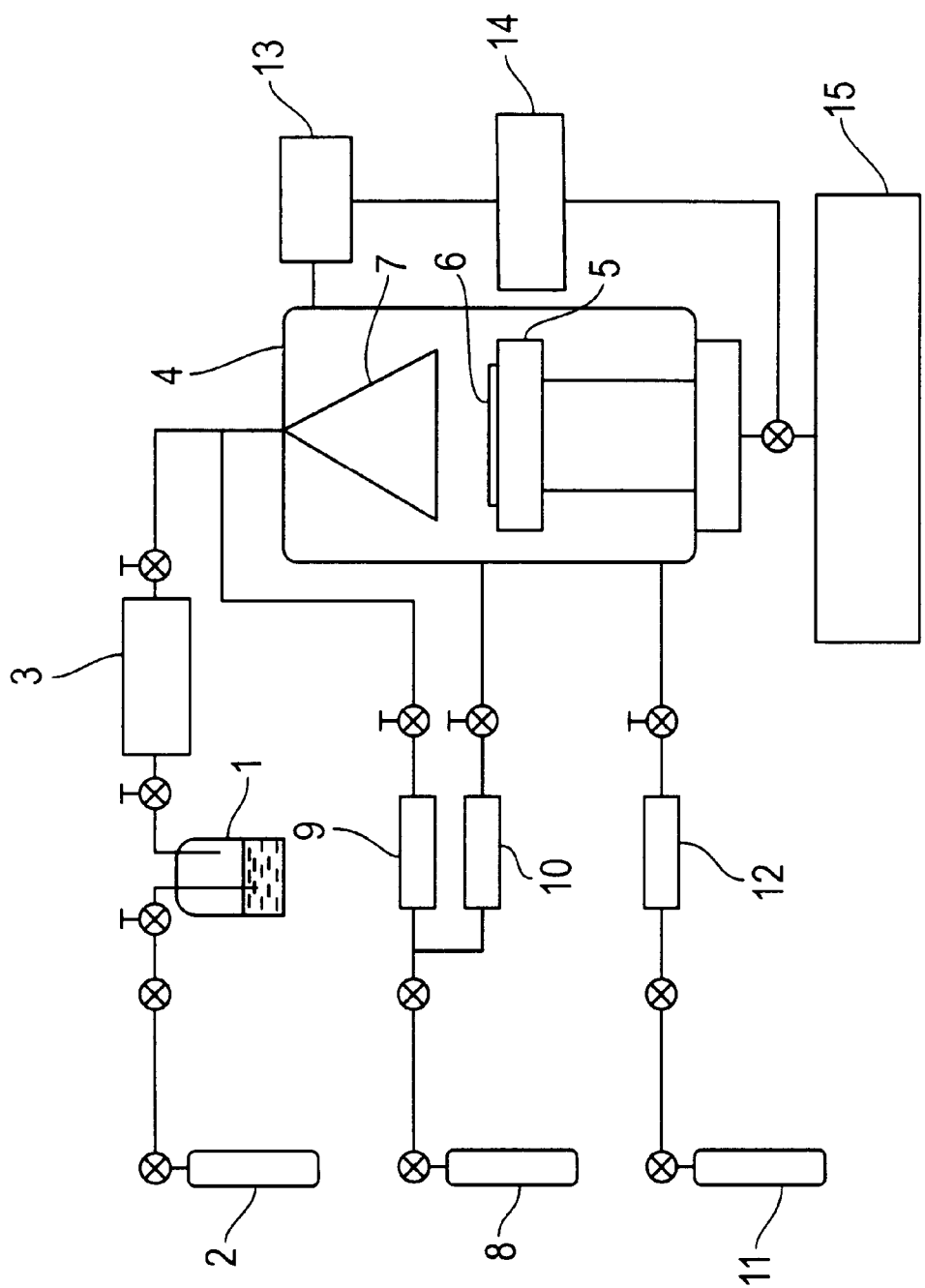
FIG. 1 is a schematic view of a first CVD apparatus for depositing a copper layer using a layer forming material according to each of embodiments of the present invention.

FIG. 1 schematically shows the general arrangement of a first CVD apparatus in which a solid layer forming material is used as a precursor. Shown in FIG. 1 are a material container 1 for housing a precursor, and a first gas reservoir 2 for supplying, to the material container 1, carrier gas low in reactivity such as Ar, $N_2$, He or the like. Housed in the material container 1 is a solid precursor as dissolved in an organic solvent. As the organic solvent, there is preferably used a substance of which boiling point is lower than 100° C., such as tetrahydrofuran or the like. When the carrier gas is supplied from the first gas reservoir 2 to the material container 1, the precursor in the material container 1 is bubbled by the carrier gas, causing the precursor to be evaporated. The precursor in the form of gas flows out from the material container 1 and is then introduced into a CVD chamber 4 after adjusted in flow amount by a first mass flow controller 3. In the CVD chamber 4, a silicon substrate 6 is placed on a heater 5. The gaseous precursor introduced into the CVD chamber 4, is supplied from a shower head 7 to the substrate 6.

Shown in FIG. 1 is a second gas reservoir 8 for housing $H_2$ gas. The $H_2$ gas supplied from the second gas reservoir 8 is mixed, as adjusted in flow amount by a second mass flow controller 9, with the precursor supplied from the material container 1 and then introduced from the shower head 7 into the CVD chamber 4. Also, the $H_2$ gas supplied from the second gas reservoir 8 is introduced, as adjusted in flow amount by a third mass flow controller 10, directly into the CVD chamber 4. To accelerate the reaction, $H_2$ gas is introduced into the CVD chamber 4. However, the $H_2$ gas introduced into the CVD chamber 4 from the shower head 7 prevents the holes in the shower head 7 from being clogged.

Also shown in FIG. 1 is a third gas reservoir 11 for housing $N_2$ gas. The $N_2$ gas supplied from the third gas reservoir 11 is introduced, as adjusted in flow amount by a fourth mass flow controller 12, directly into the CVD chamber 4. There are also shown a pressure sensor 13 for detecting the pressure of the CVD chamber 4, a pressure controller 14 for controlling the pressure of the CVD chamber 4, and gas discharge means 15 for discharging the gas in the CVD chamber 4. Thus, the gas pressure of the CVD chamber 4 is suitably adjusted by $N_2$ gas introduced into the CVD chamber 4, the pressure sensor 13, the pressure controller 14 and the gas discharge means 15.

Figure 2:
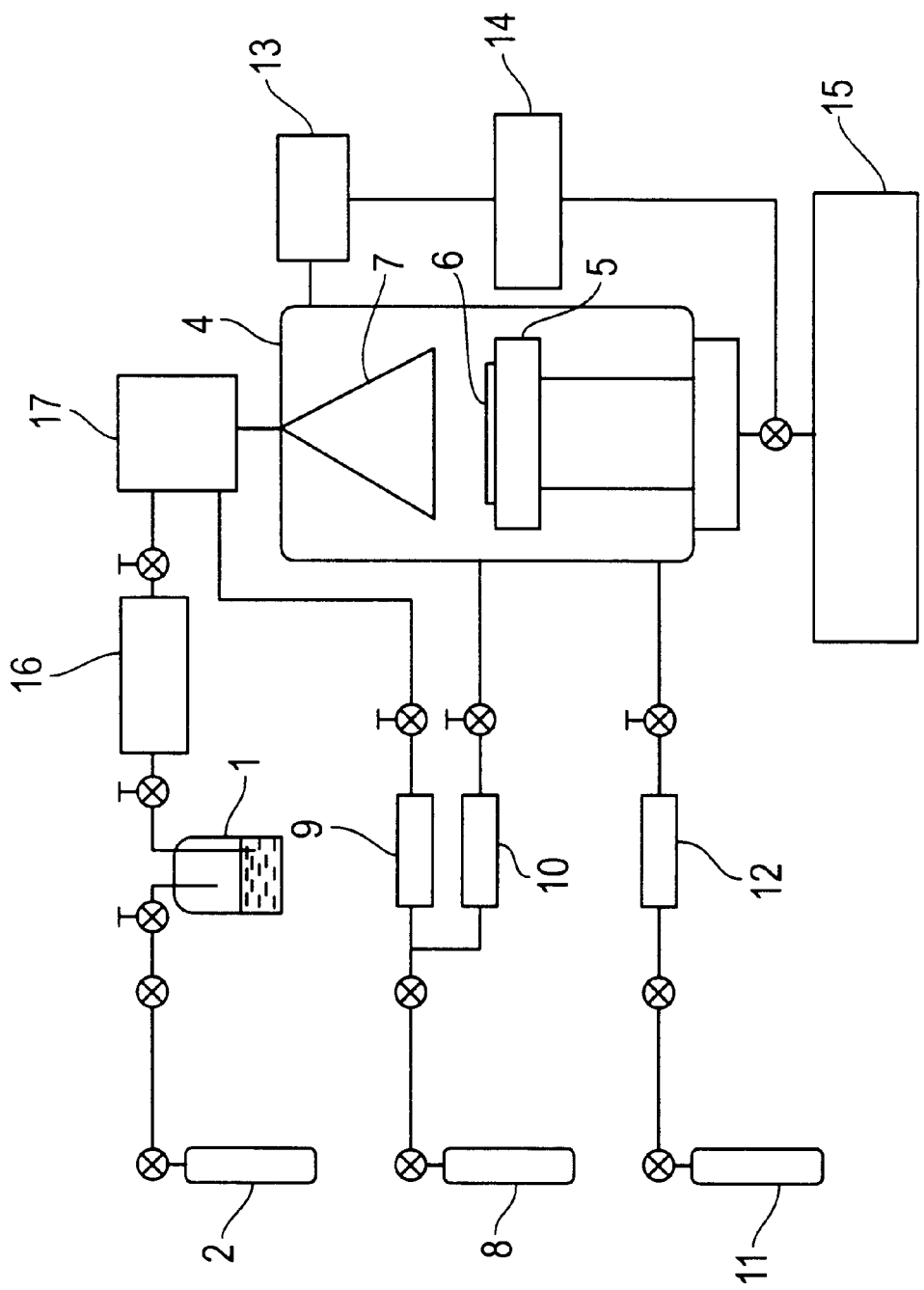
FIG. 2 is a schematic view of a second CVD apparatus for depositing a copper layer using a layer forming material according to each of the embodiments of the present invention.

FIG. 2 schematically shows the general arrangement of a second CVD apparatus in which a liquid layer forming material is used as a precursor. In the second CVD apparatus, like parts are designated by like reference numerals used in the first CVD apparatus shown in FIG. 1, and the description thereof is here omitted.

A liquid precursor is housed in a material container 1. The precursor in the material container 1 is pressurized by carrier gas and flows out in the form of a liquid from the material container 1. After adjusted in flow amount by a liquid mass flow controller 16, the precursor is evaporated by a vaporizer 17 and then introduced into a CVD chamber 4.

Figure 3:
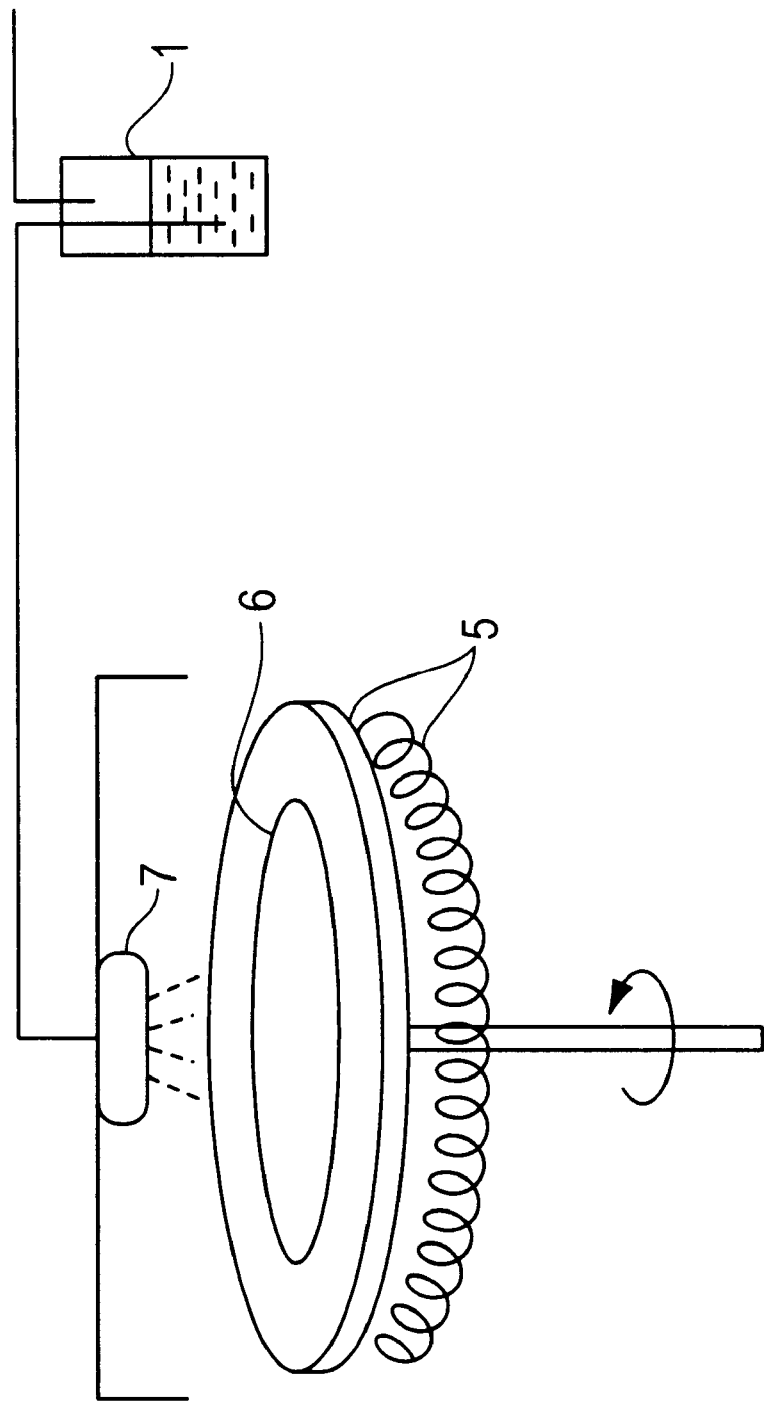
FIG. 3 is a schematic view of a spin coater to be used for depositing a copper layer using a layer forming material according to each of the embodiments of the present invention.

FIG. 3 schematically shows the arrangement of a spin coater for depositing a copper layer. After a precursor is supplied from the material container 1 to the CVD chamber 4, the precursor is dropped on a substrate 6 from a shower head 7. The surface of the substrate 6 is spin-coated with the precursor. While spin-coated with the precursor, the substrate 6 may be heated to, for example, about 400° C. by a heater 5. Alternately, the substrate 6 may be heated after spin-coated with the precursor. When the precursor on the substrate 6 is heated, a copper layer is formed on the substrate 6.

The following description will discuss a layer forming material according to a first embodiment of the present invention.

A first layer forming material of the present invention is a compound which has a structure of six-membered ring coordinated to Cu and containing Si and of which general formula is represented by the following formula:

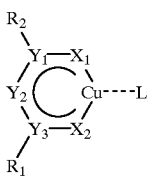

In the chemical formula of the first layer forming material, $X_1$ and $X_2$ are elements of the VI group of the same or different types which are coordinate-bonded to Cu, and of which examples include O, S, Se, Te and the like.

In the chemical formula of the first layer forming material, at least one of $Y_1$, $Y_2$ and $Y_3$ is Si and each of them is preferably Si.

In the chemical formula of the first layer forming material, L is a group which has a double or triple bond and which is able to supply electrons to Cu. Preferably, L is a group of which backbone chain has a double or triple bond and in which all the skeletons contain Si.

In the chemical formula of the first layer forming material, each of $R_1$ and $R_2$ is an optional element or compound, but is preferably a Si-containing group.

A specific example of the first layer forming material includes a substance of the following first chemical formula:

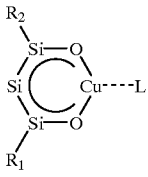

In the layer forming material represented by the first chemical formula, the structure of six-membered ring contains a number of Si elements. Accordingly, there is increased the amount of Si segregated to the surface of the copper layer at the time of a heat treatment. Thus, copper silicide is liable to be formed on the surface of copper wiring. Further, in the layer forming material of the first chemical formula, the structure of six-membered ring does not contain C. This lowers the copper wiring in resistance.

Preferably, L in the first chemical formula may be a first compound of the following formula (a) and a second compound of the following formula (b):

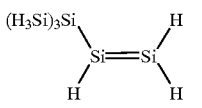 (a)

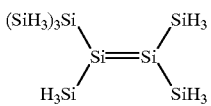 (b)

or a third compound of the following formula (c) and a fourth compound of the following formula (d):

 (c)

 (d)

The first and second compounds have a double bond (alkene), and the third and fourth compound have a triple bond (alkyne).

In the first chemical formula, there may be selected, as $R_1$ and $R_2$, substances of the same or different types from the group consisting of $SiF_3$, $SiH_3$, $CF_3$ and $CH_3$ for example. However, $SiF_3$ and $SiH_3$ are more preferable than $CF_3$ and $CH_3$. More specifically, when a Si-containing compound is used, there is increased the amount of Si segregated to the surface of the copper layer at the time of a heat treatment. This, copper silicide is liable to be readily formed on the surface of copper wiring. Further, $SiF_3$ is more preferable than $SiH_3$. This is because F has seven electrons in the shell and is therefore an excellent electron donor group. From F, a number of electrons are supplied to Si to which F is being bonded. Therefore, the electrons are dense in such Si. Accordingly, even though Si is eliminated from the skeleton (the electrons are reduced in number), $-SiF_3$ can stably be present.

The following description will discuss a layer forming material according to a second embodiment of the present invention.

A second layer forming material of the present invention is a compound which has a structure of six-membered ring coordinated to Cu and containing Si, and of which general formula is represented by the following formula:

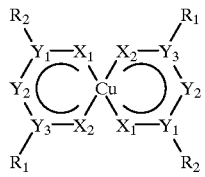

In the second layer forming material, $X_1$ and $X_2$ are elements of the VI group of the same or different types which are coordinate-bonded to Cu and of which examples include O, S, Se, Te and the like.

In the chemical formula of the second layer forming material, at least one of $Y_1$, $Y_2$ and $Y_3$ is Si and each of them is particularly preferably Si.

In the second layer forming material, each of $R_1$ and $R_2$ is an optional element or compound, but is preferably a Si-containing group.

A specific example of the second layer forming material includes a substance of the following second chemical formula:

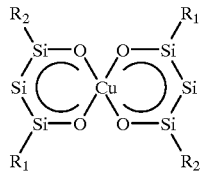

In the layer forming material of the second chemical formula, the structure of six-membered ring contains a number of Si elements. Accordingly, there is increased the amount of Si segregated to the surface of the copper layer at the time of a heat treatment. Thus, copper silicide is liable to be readily formed on the surface of copper wiring. Further, in the layer forming material of the second chemical formula, the structure of six-membered ring does not contain C. This lowers the copper wiring in resistance.

In the second chemical formula, there may be selected, as $R_1$ and $R_2$, substances of the same or different types from the group consisting of $SiF_3$, $SiH_3$, $CF_3$ and $CH_3$ for example. However, $SiF_3$ and $SiH_3$ are more preferable than $CF_3$ and $CH_3$, and $SiF_3$ is more preferable than $SiH_3$ for the reasons set forth above.

The following description will discuss a method of producing a material of the first chemical formula in which L is the first compound and in which $R_1$ and $R_2$ are represented by $SiF_3$.

The following substances:

| | |
|---|---|
| Copper chloride (I value) | 0.15 mol |
| Alkene (3,3-disilyltetrasilene) | 0.15 mol |
| 1,1,1,5,5,5-hexafluoro-pentasilan-2,4-dione potassium salt | 0.15 mol | are mixed with 200 ml of a solvent (tetrahydrofuran or n-hexane) and stirred under a stream of nitrogen gas at 40° C. for 24 hours. The resulting mixture is filtered off to produce a crude product. The crude product is then refined under reduced pressure at 60° C., thus producing a copper wiring layer forming material in dark yellow with yield of 38%.

The following description will discuss a method of producing a material of the first chemical formula in which L is the third compound and in which $R_1$ and $R_2$ are represented by $SiF_3$.

The following substances:

| | |
|---|---|
| Copper chloride (I value) | 0.15 mol |
| Alkyne (trisilyne) | 0.15 mol |
| 1,1,1,5,5,5-hexafluoro-pentasilan-2,4-dione potassium salt | 0.15 mol | are mixed with 200 ml of a solvent (tetrahydrofuran or n-hexane) and stirred under a stream of nitrogen gas at 50° C. for 30 hours. The resulting mixture is filtered off to produce a crude product. The crude product is then refined under reduced pressure at 65° C., thus producing a copper wiring layer forming material in dark yellow with yield of 23%.

The following description will discuss a method of producing a material of the first chemical formula in which L is the first compound and in which $R_1$ and $R_2$ are represented by $CF_3$.

The following substances:

| | |
|---|---|
| Copper chloride (I value) | 0.15 mol |
| Alkene (3,3-disilyltetrasilene) | 0.15 mol |
| 1,3-trifluoromethyl-trisilan-1,3-dione potassium salt | 0.15 mol | are mixed with 200 ml of a solvent (tetrahydrofuran or n-hexane) and stirred under a stream of nitrogen gas at 40° C. for 24 hours. The resulting mixture is filtered off to produce a crude product. The crude product is then refined under reduced pressure at 40° C., thus producing a copper wiring layer forming material in dark yellow with yield of 54%.

The following description will discuss a method of producing a material of the first chemical formula in which L is the third compound and in which $R_1$ and $R_2$ are represented by $CF_3$.

The following substances:

| | |
|---|---|
| Copper chloride (I value) | 0.15 mol |
| Alkyne (trisilyne) | 0.15 mol |
| 1,3-trifluoromethyl-trisilan-1,3-dione potassium salt | 0.15 mol | are mixed with 200 ml of a solvent (tetrahydrofuran or n-hexane) and stirred under a stream of nitrogen gas at 50° C. for 24 hours. The resulting mixture is filtered off to produce a crude product. The crude product is then refined under reduced pressure at 50° C., thus producing a copper wiring layer forming material in dark yellow with a yield of 46%.

The following description will discuss a method of producing a material of the second chemical formula in which $R_1$ and $R_2$ are represented by $SiF_3$.

The following substances:

| | |
|---|---|
| Copper chloride (II value) | 0.15 mol |
| 1,1,1,5,5,5-hexafluoro-1,3-pentasilan-2,4-dione potassium salt | 0.30 mol | are mixed with 200 ml of a solvent (tetrahydrofuran or n-hexane), dehydrated under a stream of nitrogen gas at room temperature, and then stirred for 16 hours. The resulting mixture is filtered off to produce a crude product. The crude product is then refined under reduced pressure at 65° C., thus producing a copper wiring layer forming material in dark blue with yield of 56%.

The following description will discuss a first wiring forming method of forming copper wiring on a substrate with the use of the first or second layer forming material according to the present invention.

Figure 4:
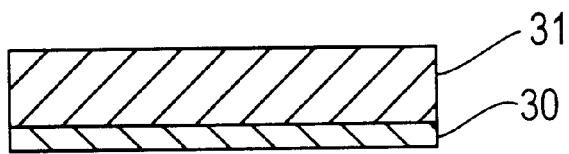
FIGS. 4(a) to (f) are section views of the steps of a first wiring forming method using a layer forming material according to each of the embodiments of the present invention.
Figure 4:
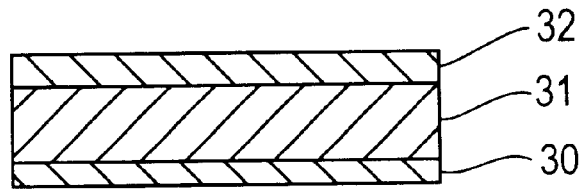
Figure 4:
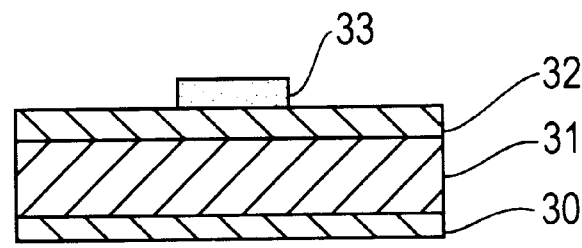
Figure 4:
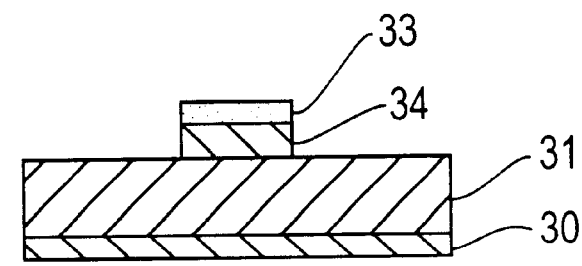
Figure 4:
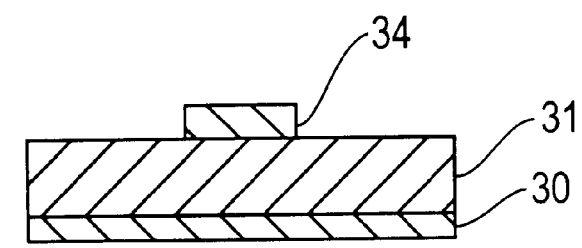
Figure 4:
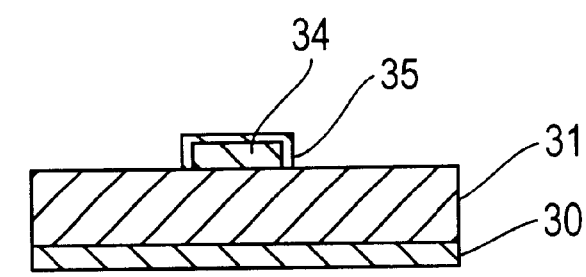

As shown in FIG. 4(a), an insulating layer 31 of $SiO_2$ for example is deposited on a substrate 30 of Si, and the layer forming material according to the first or second embodiment is then supplied onto the insulating layer 31 b a CVD method. Then, as shown in FIG. 4(b), a Si-containing copper layer 32 is deposited on the insulating layer 31.

As shown in FIG. 4(c), a resist pattern 33 is formed on the copper layer 32. Then, as shown in FIG. 4(d), the copper layer 32 is etched with the resist pattern 33 serving as a mask, thereby to form copper wiring 34 formed by the copper layer 32.

Then, as shown in FIG. 4(e), after the resist pattern 33 is removed, the substrate 30 is thermally treated in a vacuum at 500° C. This causes Si contained in the copper wiring 34 to be segregated to the surface of the copper wiring 34 such that a copper silicide layer 35 is formed on the surface of the copper wiring 34. The copper silicide layer 35 serves as a barrier layer (self diffusion barrier layer) for preventing the copper wiring 34 from being oxidized.

The following description will discuss a second wiring forming method of forming copper wiring on a substrate with the use of the first or second layer forming material according to the present invention.

Figure 5:
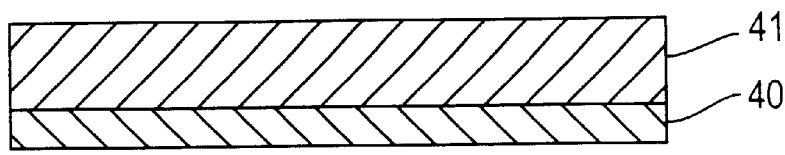
FIGS. 5(a) to (f) are section views of the steps of a second wiring forming method using a layer forming material according to each of the embodiments of the present invention.
Figure 5:
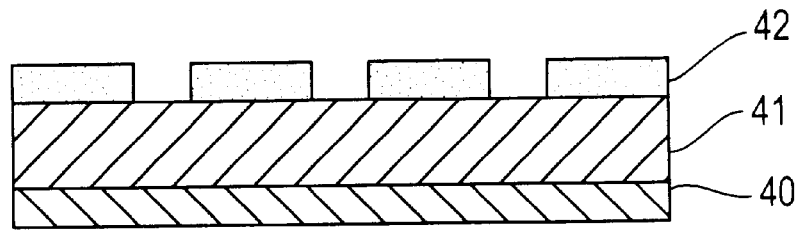
Figure 5:
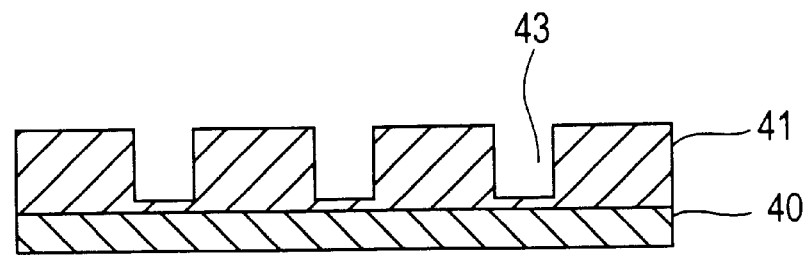
Figure 5:
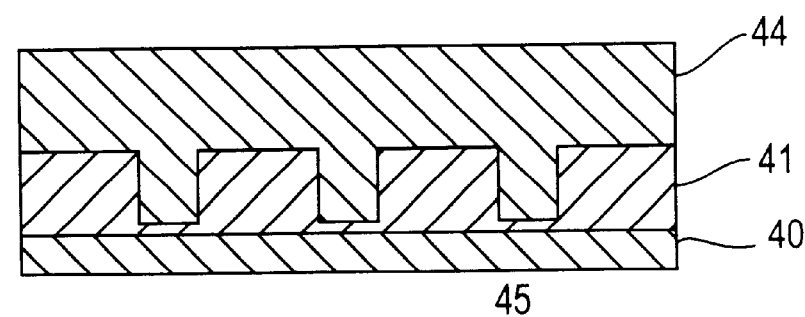
Figure 5:
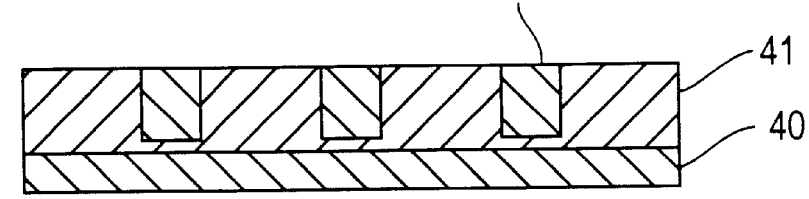
Figure 5:
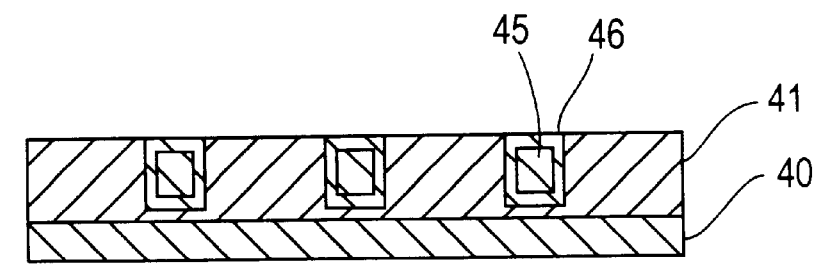
Figure 8:
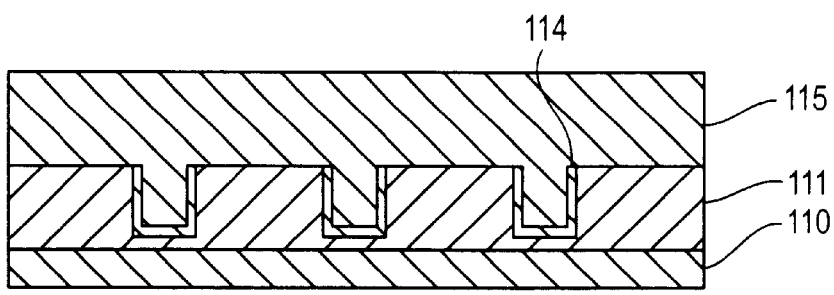
FIGS. 8(a) to (c) are section views of steps of the second wiring forming method of prior rt.
Figure 8:
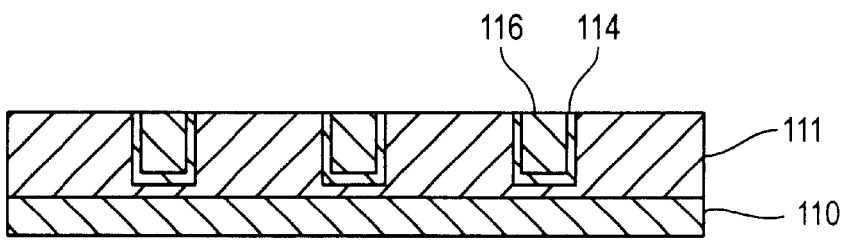
Figure 8:
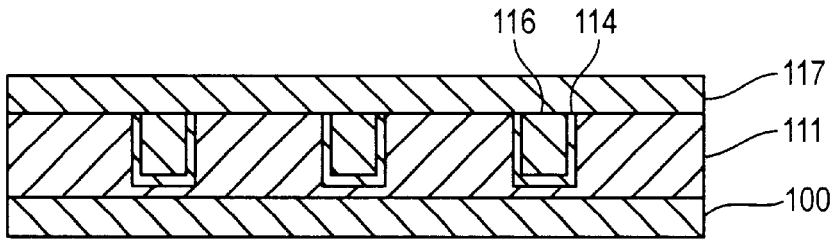

As shown in FIG. 5(a), an insulating layer 41 of $SiO_2$ for example is deposited on a substrate 40 of Si. Then, as shown in FIG. 5(b), a resist pattern 42 is formed on the insulating layer 41. Then, as shown in FIG. 5(c), the insulating layer 41 is etched with the resist pattern 42 serving as a mask, thereby to form a concave groove 43 which will result in a wiring zone.

Then, the layer forming material according to the first or second embodiment is supplied to the insulating layer 41 by a CVD method. Thus, as shown in FIG. 5(d), a Si-containing copper layer 44 is deposited on the insulating layer 41. Then, by a CMP method for example, that portion of the copper layer 44 which projects from the insulating layer 41, is removed, thereby to form copper wiring 45 formed by the copper layer 44.

Then, the substrate 40 is thermally treated in a vacuum at 500° C. This causes Si contained in the copper wiring 45 to be segregated to the surface of the copper wiring 45 such that a copper silicide layer 46 is formed on the surface of the copper wiring 45. The copper silicide layer 46 serves as a barrier layer (self diffusion barrier layer) for preventing the copper wiring 45 from being oxidized.

What is claimed is:

1. A layer forming material comprising a compound which has a structure of six-membered ring coordinated to Cu and containing Si, and of which general formula is represented by the following chemical formula:

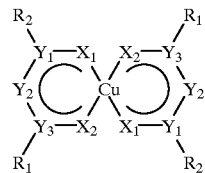

wherein $X_1$ and $X_2$ are elements of the VI group of the same or different types which are coordinate-bonded to Cu, each of $Y_1$, $Y_2$ and $Y_3$ is Si, and each of $R_1$ and $R_2$ is selected from the group consisting of $SiF_3$, $SiH_3$, $CF_3$ and $CH_3$.

* * * * *